United States Patent
Humphrey et al.

(10) Patent No.: US 7,202,683 B2
(45) Date of Patent: Apr. 10, 2007

(54) CLEANING SYSTEM, DEVICE AND METHOD

(75) Inventors: Gene Humphrey, Livermore, CA (US); Jerry Broz, Longmont, CO (US); Joyce Adams, Reno, NV (US)

(73) Assignee: International Test Solutions, Reno, NV (US)

( * ) Notice: Subject to any disclaimer, the term of this patent is extended or adjusted under 35 U.S.C. 154(b) by 0 days.

(21) Appl. No.: 10/825,718

(22) Filed: Apr. 16, 2004

(65) Prior Publication Data

US 2005/0001645 A1    Jan. 6, 2005

Related U.S. Application Data

(63) Continuation-in-part of application No. 09/624,750, filed on Jul. 24, 2000, now Pat. No. 6,777,966.

(60) Provisional application No. 60/146,526, filed on Jul. 30, 1999.

(51) Int. Cl.
*G01R 31/02* (2006.01)
(52) U.S. Cl. .................................... 324/757
(58) Field of Classification Search .............. 324/754, 324/757, 758, 761; 134/6, 22.1, 22.11, 18, 134/42; 15/4, 21.1, 97.1, 104.002, 104.93; 451/36, 59, 533–534, 537
See application file for complete search history.

(56) References Cited

U.S. PATENT DOCUMENTS

| | | | |
|---|---|---|---|
| 2,800,215 A | 7/1957 | Converse | |
| 3,148,404 A | 9/1964 | Jensen | |
| 4,590,422 A * | 5/1986 | Milligan | 324/754 |
| 5,220,279 A | 6/1993 | Nagasawa | |
| 5,813,081 A | 9/1998 | Wang et al. | |
| 5,968,282 A * | 10/1999 | Yamasaka | 324/754 |
| 5,998,986 A * | 12/1999 | Ido | 324/754 |
| 6,037,793 A * | 3/2000 | Miyazawa et al. | 324/760 |
| 6,057,694 A * | 5/2000 | Matsudo | 324/757 |
| 6,118,289 A * | 9/2000 | Kitani et al. | 324/754 |
| 6,118,290 A * | 9/2000 | Sugiyama et al. | 324/754 |
| 6,127,831 A * | 10/2000 | Khoury et al. | 324/754 |
| 6,130,104 A * | 10/2000 | Yamasaka | 324/754 |
| 6,573,702 B2 * | 6/2003 | Marcuse et al. | 324/757 |
| 6,777,966 B1 * | 8/2004 | Humphrey et al. | 324/757 |
| 6,908,364 B2 * | 6/2005 | Back et al. | 451/36 |

\* cited by examiner

*Primary Examiner*—Jermele Hollington
(74) *Attorney, Agent, or Firm*—DLA Piper US LLP

(57) ABSTRACT

The cleaning device may clean probe elements. The probe elements may be the probe elements of a probe card testing apparatus for testing semiconductor wafers or semiconductor dies on a semiconductor wafer or the probe elements of a handling/testing apparatus for testing the leads of a packaged integrated circuit. During the cleaning of the probe elements, the probe card or the handler/tester is cleaned during the normal operation of the testing machine without removing the probe card from the prober. The cleaning device has a working surface with a particular characteristic (a matte finish or a conductive material) so that a prober is capable of automatically determining the location of the working surface of the cleaning device and therefore operate in an automatic cleaning mode.

11 Claims, 7 Drawing Sheets

CLEANING SYSTEM, DEVICE AND METHOD

RELATED CASES/PRIORITY CLAIM

This application is a continuation in part and claims priority under 35 USC 120 to U.S. patent application Ser. No. 09/624,750, filed on Jul. 24, 2000 now U.S. Pat. No. 6,777,966 and entitled "Cleaning System, Device and Method" which in turn claims priority under 35 USC 119(e) to U.S. Provisional Patent Application No. 60/146,526 filed Jul. 30, 1999. Both applications are incorporated herein by reference.

BACKGROUND OF THE INVENTION

This invention relates generally to a medium for cleaning a manual test interface while it is still in the prober. This manual interface is generally referred to as a probe card, which is used in the prober to make an electrical connection between the die on a silicon wafer and the tester so that the functionality of the die may be evaluated.

Currently, the method for cleaning the probe card is to remove it from the prober and manually clean the debris from the probe tips. The probe tips need to be cleaned to remove debris from them since the debris reduces the quality of the electrical circuit completed by the contact of the probe tips to any surfaces on a die. The completed electrical circuit is used to evaluate the electrical characteristics of the die by the test apparatus. The degradation of the quality of the electrical circuit caused by the probe tip debris may be interpreted by the test apparatus as a failure of the die under test even though the die is functioning correctly. This false failure of the die results in the rejection or the rework of good die thereby increasing the cost of the final products sold. In the industry, it has been seen that a 1% change in yield from an individual prober can equate to more than $1,000,000 per annum. Therefore, with thousands of probers operating worldwide, the impact to the industry from maintaining clean probes during testing can be very substantial.

Individual semiconductor (integrated circuit) devices are typically produced by creating multiple devices on a silicon wafer using well known semiconductor processing techniques including photolithography, deposition, and sputtering. Generally, these processes are intended to create multiple, fully functional integrated circuit devices prior to separating (singulating) the individual devices (dies) from the semiconductor wafer. However, in practice, physical defects in the wafer material and defects in the manufacturing processes invariably cause some of the individual devices to be non-functional, some of which may be repairable. It is desirable to identify the defective devices prior to separating or cutting the dies on the wafer. In particular, some product is actually repairable when the flaws are caught at the wafer lever. Other product may not be repairable but may be used in a downgraded application from the original product. This determination of the product's capabilities (a product definition provided by electrical probe testing) at the wafer level saves the manufacturer considerable cost later in the manufacturing process. In addition, product cost may be reduced if defective devices are identified.

To enable the manufacturer to achieve this testing capability a probe card, prober and tester are employed to make temporary electrical connections to the bonding pads, solder or gold bumps or any surface on the chip where connection can be made by making manual contact to that surface. The surface may be on the individual circuit device or on multiple circuit devices when the devices are still part of a wafer. Once the connections between the tester and the circuit device are made, power and electrical signals are transferred from the tester to the device for testing, to determine its functionality and whether the device is accepted or rejected for further processing. Typically, the temporary connections to the device bonding elements are made by contacting multiple electrically conductive probes (often needle like structures) against the electrically conductive bonding elements of the device. By exerting controlled pressure (downwards force on the bonding pads) of the probe tips against the bonding pads, solder balls and/or gold bumps, a satisfactory electrical connection is achieved allowing the power, ground and test signals to be transmitted.

The tester and prober need a manual interface to the bonding elements on the die to achieve contact. A probe card having a plurality of probes is used to make the connection with the bonding pads of the semiconductor die. The probes may be cantilever beams or needles or vertical beams. Typically, each probe is an inherently resilient spring device acting as a cantilever beam, or as an axially loaded column. A variation is to mount multiple probes in a spring-loaded support. In a conventional prober, the probe card, and its multiple probes, are held in precise mechanical alignment with the bonding elements of the device under test (or multiple devices, or wafer as the case may be) and the device is vertically translated into contact with the tips of the probes. In the typical prober, the tips of the probes may perform a scrubbing action in which the tip of the probes moves horizontally as it contacts the bonding pad in order to scrub away oxide, or any other material on the pad, that may inhibit the electrical contact between the probes and the bonding pads. Although the scrubbing action improves the electrical contact between the probe tip and the bonding pad, it unfortunately also generates some debris (the scraped up oxide or other debris) that may also prevent the probe tip from making a good electrical contact with the bonding pad. Alternatively, the probe tip may press vertically into the bonding pad, solder or gold bump with sufficient force to penetrate any surface material and establish good electrical contact. The probe tip may become contaminated with contaminates such as aluminum, copper, lead, tin, gold, bi-products, organic films or oxides resulting from the wafer and semiconductor device manufacturing and testing processes.

Typically, the debris generated by probing needs to be periodically removed from the probe elements to prevent a build-up which causes increased contact resistance, continuity failures and false test indications, which in turn results in artificially lower yields and subsequent increased product costs. Typically, the entire probe card with the plurality of probes must be removed from the prober and cleaned or abrasively cleaned in the prober. In a typical prober, the probe card can be cleaned several times an hour, several time during a single wafer test, several times during a wafer lot, several times before lot start, and several times after lot start. Also, some operators may clean the probe several times during the initial setup of the test equipment.

The process of cleaning in the prober using an abrasive pad burnishes the tips but it does not remove the debris. The burnishing actually causes wear to the probe card by shortening the probe tips. In addition, since it does not remove the debris, and since the debris exhibits a slight electrical charge, it attracts more debris so the probe card will require cleaning more often than the original clean card. Currently the debris from burnishing can be removed manually by means of alcohol and a cotton tip swab, an air gun or an inert gas purge. The probers also utilize a brush unit comprised of natural or synthetic fibers to remove debris from the tips of a probe card. However, the brush operation tends to provide inconsistent cleaning and debris removal. The brush operation has the potential to damage the planarity and alignment of the probes and may push contaminants into the array of the probes or up into the probe guide-plates. Furthermore, some of the particulates during this operation may not be captured within the body of the brush and can become air-borne. This is of particular concern when these particulates are environmentally hazardous. Further details of this known brush unit are shown and described in U.S. Pat. No. 5,968,282. Each method cleans the probes but requires stopping the prober or manual intervention to perform the function.

Other contaminates, such as lead and tin, may be removed by abrasive cleaning/burnishing or cleaning the probes with a solution that may typically be an acid, for example. When probe cards which have collected lead and tin are burnished, particulates of lead are released into the air that cause environmental hazards. In addition, the acid solution requires a separate, rather expensive machine that sprays the solution onto the tips in a closed chamber. These typical cleaning processes are expensive since the tester will have down time and a replacement card must be purchased to run while the other probe card is being cleaned. In addition, the equipment and manual labor adds additional costs to the task performed.

It is desirable to provide a probe card cleaning device and method which overcomes the above limitations and drawbacks of the conventional cleaning devices and methods so that the probe cards may be cleaned more rapidly and effectively while in the prober and it is to this end that the present invention is directed. The cleaning device and method may also be used with other devices.

SUMMARY OF THE INVENTION

In accordance with the invention, a cleaning medium is provided that will clean the probes of a probe card without removing the probe card from the prober. In particular, the cleaning medium may be placed within the prober similar to a wafer being tested so that the probes of the probe card contact the cleaning medium periodically to remove debris and/or contaminates from the probes. In a preferred embodiment, the cleaning medium may include a substrate that may be shaped like a typical semiconductor wafer that typically fits into the prober. In other embodiments, the substrate may be of various shapes and sizes and thickness. In one embodiment, a ceramic plate or any type of substrate may be used that fits over or replaces the abrasive plate in the prober. The pad may have predetermined mechanical and/or chemical characteristics, such as abrasiveness, density, elasticity, tackiness, planarity, and/or chemical properties, such as being acetic or basic, so that when the probe tips contact the pad surface, the tips of the probes are cleaned and the debris and contaminates are removed from the tips. In another embodiment, the pad may be made of a material so that the probe tips may penetrate into or through the pad, which cleans the debris from the tips. In a preferred embodiment, the substrate may be a semiconductor wafer, ceramic, or any material to which the cleaning pad will attach. In another embodiment, the physical properties of the pad, such as density and abrasiveness, may be predetermined so as to clean the probe element and remove bonded or embedded debris from the probe elements without causing significant damage to the probe elements. In another embodiment, the physical properties of the pad, such as density and abrasiveness, may be predetermined so as to shape or reshape the probe elements during probing on or into the medium.

Thus, in accordance with the invention, a cleaning medium for cleaning probe elements in a semiconductor testing apparatus is provided wherein the cleaning medium comprises a substrate having a configuration to be introduced into the testing apparatus during normal testing operation, and a pad, secured to the substrate. The pad has predetermined characteristics, which clean debris from the probe elements and maintain or modify the shape of the probe element when the elements contact or penetrate into or through the pad.

In accordance with another aspect of the invention, a method for cleaning the probe elements on a prober or an analyzer is provided wherein the method comprises loading a cleaning medium into the prober, the cleaning medium having the same configuration as the wafers with the semiconductor dies normally tested by the testing apparatus and the cleaning medium having a top surface with predetermined properties, such as abrasiveness, tack, hardness, that clean the probes. The method further comprises contacting the probe elements with the cleaning medium during the normal testing operation in the prober so that any debris is removed from the probe elements during the normal operation of the prober or analyzer.

In accordance with another aspect of the invention, a method for maintaining or modifying the shape of the probe elements on a prober or an analyzer is provided wherein the method comprises loading a cleaning medium into the prober or analyzer, the medium having varying density, tack, abrasiveness or other physical characteristics which are optimized for various probe elements of the probe cards.

In accordance with another aspect of the invention, the pad may have a particular surface finish such that the prober/tester device is capable of detecting the surface of the cleaning pad. The surface texture may also contribute to the cleaning efficiency of the working surface polymer material. When the prober/tester is capable of detecting the surface of the cleaning pad, then the prober is able to be set into an automatic cleaning mode. In the automatic cleaning mode, the prober/tester will automatically determine when to clean its probe tips, locate the cleaning pad, clean the probe tips on the cleaning pad and then return to testing operations. In one embodiment of the invention, the pad surface may be a matte finish which permits the prober/tester to optically determine the location of the surface of the cleaning pad. In another embodiment of the invention, the pad may be formed from a conductive polymer such that a tester/prober that detects a surface using conductance is able to detect the surface of the cleaning pad.

DETAILED DESCRIPTION OF A PREFERRED EMBODIMENT

The invention is particularly applicable to a cleaning medium for cleaning the probes in a prober and it is in this context that the invention will be described. It will be appreciated, however, that the device and method in accordance with the invention has greater utility, such as cleaning other types of semiconductor processing equipment. The cleaning method can also be used on an analyzer which is a metrology tool used in the routine maintenance of probe cards.

Figure 1:
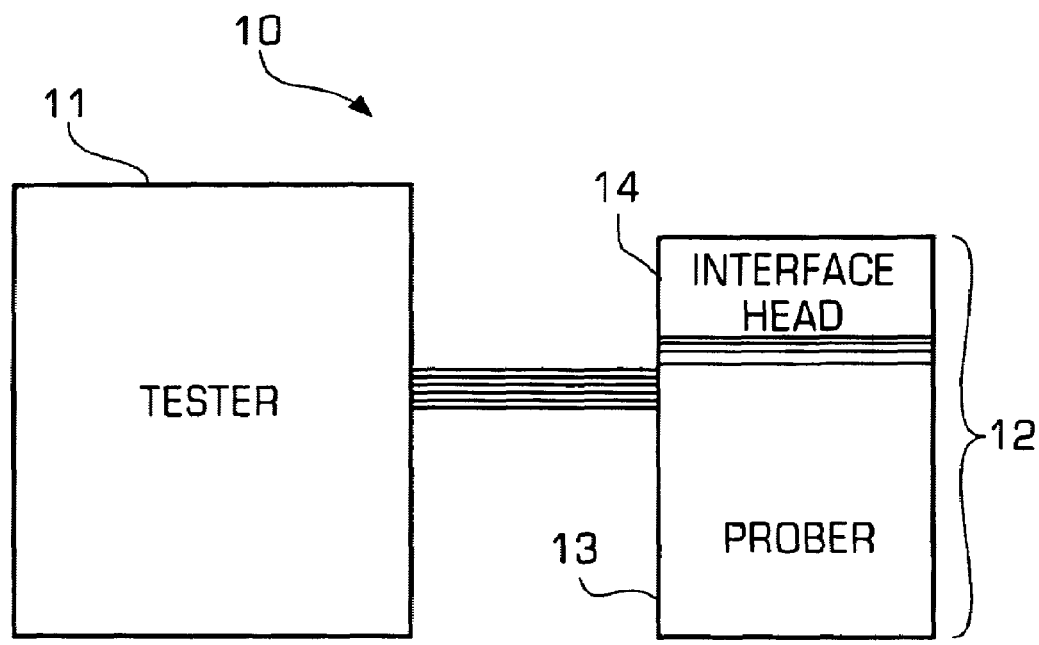
FIG. 1 is a side view of an automated testing system that may include the cleaning device in accordance with the invention.
Figure 2:
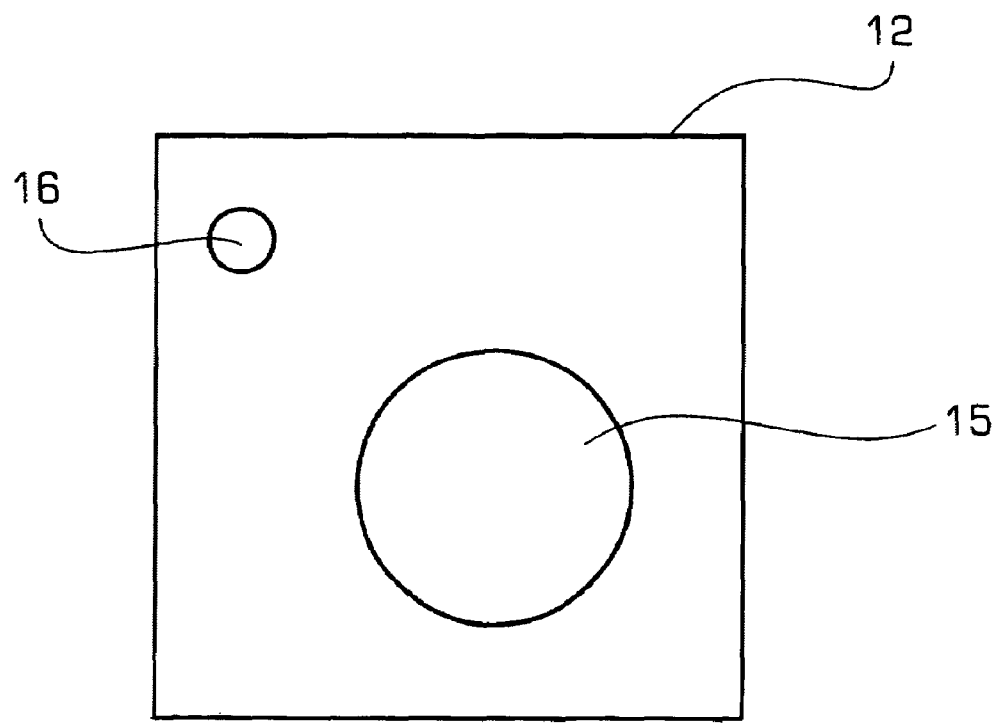
FIG. 2 is a top view of the automated testing system of FIG. 1.

FIGS. 1 and 2 are diagrams illustrating a testing system 10 that may be cleaned using the cleaning medium in accordance with the invention. In particular, the system 10 may include a tester 11 electrically connected to a prober machine 12 that may actually apply the probes to the semiconductor wafer or die and test them. The prober machine 12 may further include a prober 13 and an interface head 14 as shown in FIG. 1. The prober machine 12 may also have an abrasion/sanding disk 16, which is typically used to burnish the probe tips, as shown in FIG. 2. The prober may also include a brush attachment that is shown in more detail in U.S. Pat. No. 5,968,282 which is incorporated herein by reference. The prober machine 12 may also include a prober chuck 15 that moves the wafers/dies during the testing process. Instead of the typically removing the prober card in order to clean the probe elements, the cleaning device in accordance with the invention permits the probe elements to be cleaned while the prober is operating. In particular, a cleaning wafer cassette containing the cleaning device in accordance with the invention may be introduced periodically into the testing system in accordance with the invention. Alternatively, a cleaning device in accordance with the invention may be loaded into each cassette with other wafers being tested so that the probe elements are cleaned each time a cassette of wafers is tested. Thus the cleaning medium will clean the probe needles during the normal testing operation of the prober. Now the cleaning medium in accordance with the invention will be described in more detail.

Figure 3:
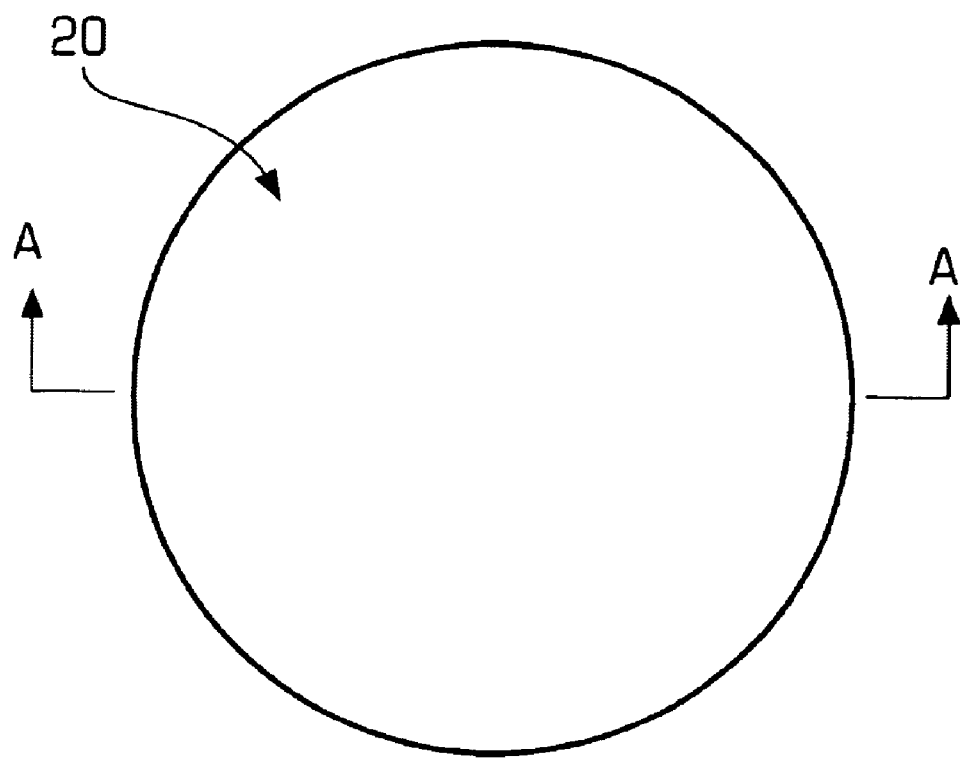
FIG. 3 is a top view of an embodiment of a cleaning device in accordance with the invention.
Figure 4:
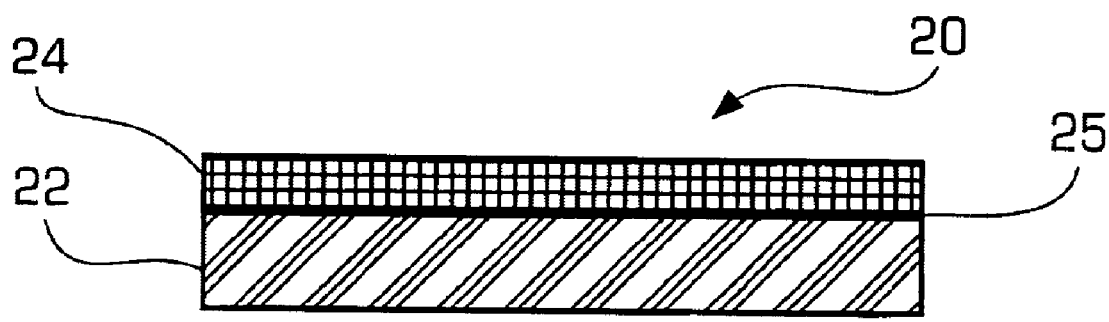
FIG. 4 is a sectional view taken along line A—A in FIG. 3 of the cleaning device in accordance with the invention.

FIGS. 3 and 4 are diagrams illustrating an embodiment of a cleaning device 20 in accordance with the invention. In accordance with the invention, the cleaning device 20 may be manufactured using various substrate materials, different size substrates, different shape substrates or without a substrate in some applications. As shown in FIG. 4, the cleaning device 20 may include a substrate 22 and a pad 24 secured or adhered to a surface 25 of the substrate. The substrate may be any material that can support the pad and has sufficient strength to resist breaking when the probes come into contact with the pad and generate a contact force. Thus, the substrate may be plastic, metal, glass, silicon, ceramic or any other similar material. In a preferred embodiment, the substrate 22 may be a semiconductor wafer. The wafer surface 25 onto which the pad is secured or adhered may have a flat mirror finish or a slightly abrasive roughness finish with microroughness of about 1–3 μm. The abrasive finish may burnish/abrade the probe tips during the cleaning process.

The pad 24 may be made of a material with predetermined properties that contribute to the cleaning of the probe elements tips that contact the pad. For example, the pad may have abrasive, density, elasticity, and/or tacky properties that contribute to cleaning the probe tips. The abrasiveness of the pad will loosen debris during the scrubbing action and remove unwanted material from the tips. Using a more dense material, the abrasiveness of the pad may round or sharpen the probe tips. The pad may further be used to reshape a flat probe tip into a semi-radius or a radius probe tip. Furthermore, the pad may be used to re-furbish the tip shape of "used" probe cards. Typical abrasives that may be incorporated into the pad may include aluminum oxide, silicon carbide, and diamond although the abrasive material may also be other well known abrasive materials. The abrasive may include spatially distributed particles of aluminum oxide, silicon carbide, or diamond. The tackiness of the pad may cause any debris on the probe tip to preferentially stick to the pad and therefore be removed from the probe tip. In a preferred embodiment, the pad may be made of an elastomeric material that may include rubbers and both synthetic and natural polymers. The elastomeric material may be a material manufactured with a slight tackiness or some abrasive added to the body of the material. The material may have a predetermined elasticity, density and surface tension parameters that allow the probe tips to penetrate the elastomeric material and remove the debris on the probe tips without damage to the probe tip, while retaining the integrity of the elastomeric matrix. In the preferred embodiment, the elastomeric material may be the Probe Clean material commercially sold by International Test Solutions, Inc. The material may have a thickness generally between 1 and 20 mils thick. The thickness of the pad may be varied according the specific configuration of the probe tip.

As the one or more probe elements of the prober contact the pad during the normal operation of the prober machine, they exert a vertical contact force to drive the probe element into the pad where the debris on the probe elements will be removed and retained by the pad material. In other embodiments of the cleaning system, the cleaning efficiency of the material can be improved with either a horizontal translation and/or an orbital motion of the cleaning unit during the probe tip cleaning operation.

The amount and size of the abrasive material added to the elastomer may vary according the configuration and material of the probe elements to achieve a pad that will remove the debris but will not damage the probe elements. The pad material and abrasiveness may be adjusted during the manufacturing of a pad when the pad is used to reshape, sharpen or refurbish the probe element tips. The same cleaning and reshaping may also be accomplished by the substrate alone.

Once the optimal probe tip shape has been established, conventional abrasive methods affect the integrity of the tip shape, probe card planarity and alignment, and, over time, degrade probe card performance and reduce probe card service life. Furthermore, these destructive cleaning methods remove material from the test probe tip and reduce the probe card life by damaging the test probe tip, degrading the electrical performance and compromising any test probe tip shape related properties. In accordance with the invention, the cleaning system and pad not only removes and collects adherent particulates from the test probe contact surface but maintains the shape and geometric properties of the test probe tip contact surface. The insertion of the test probe tips into the cleaning device 20 removes adherent debris from the probe tip length and probe beam without leaving any organic residue that must be removed. Spectral analysis shows no material transfer from the cleaning material onto the contact surface of the test probe. Furthermore, the overall probe card electrical characteristics are unaffected. Now, a method for cleaning a plurality of probe elements in accordance with the invention will be described.

Figure 5:
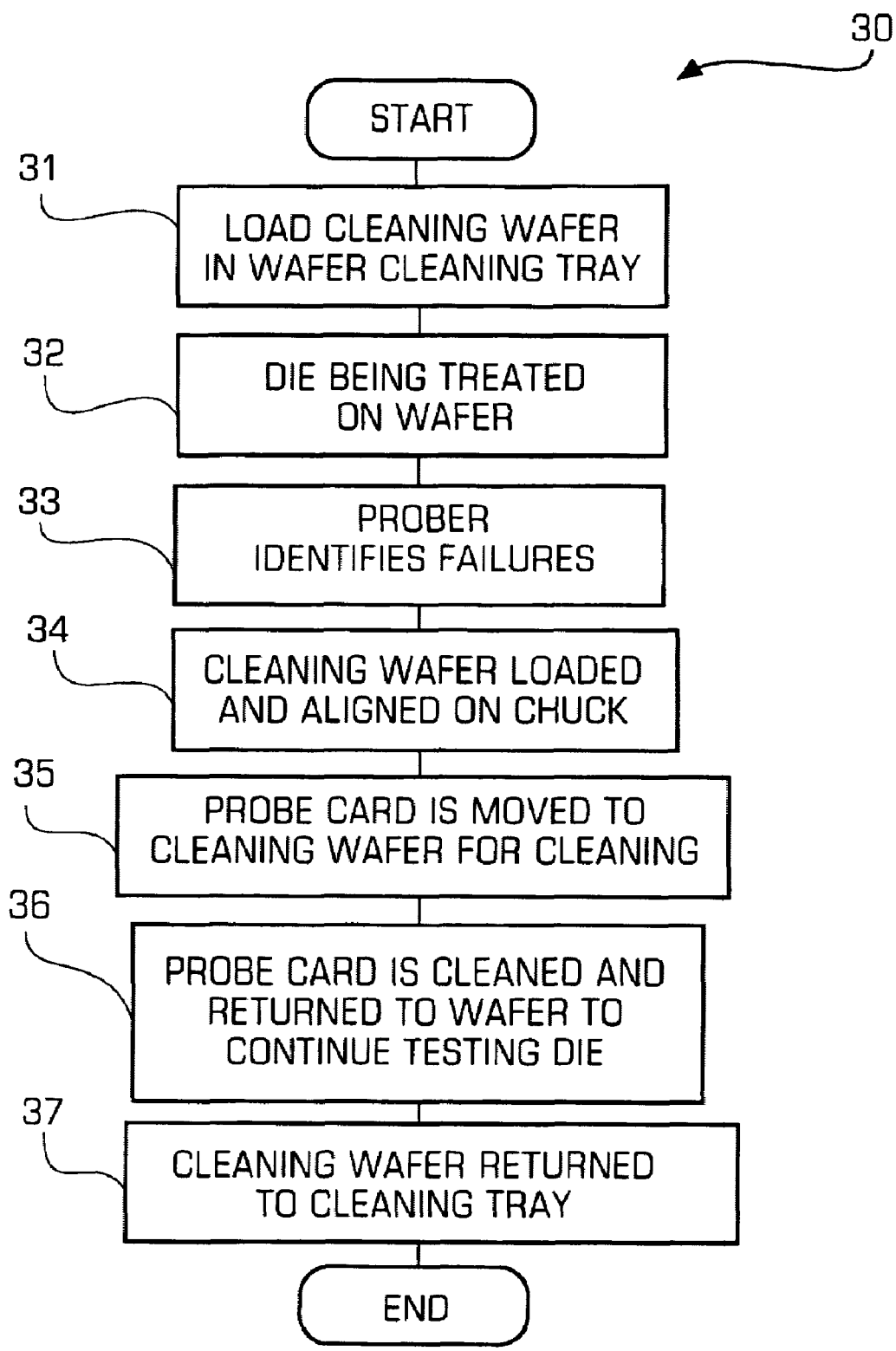
FIG. 5 is a flowchart illustrating a method for cleaning a probe tip in accordance with the invention.

FIG. 5 is a flowchart illustrating a method 30 for cleaning a plurality of probes in accordance with the invention. The method accomplishes the goal of removing the debris from the probe tips without removing the probe card from the prober, which increases the productivity of the tester. In step 31, the cleaning device, that may have the same size and shape as typical wafers containing the dies being tested by the tester, may be inserted into a wafer cleaning tray. In accordance with the invention, the cleaning medium may be located in the wafer cleaning tray or one or more cleaning pads may be inserted into one or more cassettes that also contain wafers with semiconductor devices to be tested so that, as each cassette is run through the tester, the cleaning device in the cassette cleans the probe elements. In step 32, the tester is operated and tests the semiconductor dies on the wafers. In step 33, the prober identifies a predetermined number of failures in the dies being tested which indicates that the prober element's may be dirty. In step 34, the cleaning device in accordance with the invention (a wafer) is loaded and aligned with the chuck. In step 35, the probe elements in the tester contact the cleaning device so that the debris is removed from the probe elements or the tips of the probes may be reshaped. As described above, this cleaning step may occur either when the cleaning device is periodically installed from the wafer cleaning tray into the prober or every time from the wafer cassette, or anytime the prober cleans the probe card on the burnishing plate. In step 36, the cleaning is completed and the prober returns to testing the die and wafers. In step 37, the cleaning wafer is returned to the cleaning tray so that the prober machine can continue to test dies. In accordance with the invention, the cleaning device does not interrupt, in any way, the operation of the prober since the cleaning of the probes is accomplished during the normal operation of the testing machine. In this manner, the cleaning device is inexpensive and permits the probe to be cleaned and/or shaped without removing the probe card from the prober. Now, another embodiment of the cleaning device in accordance with the invention will be described.

Figure 6A:
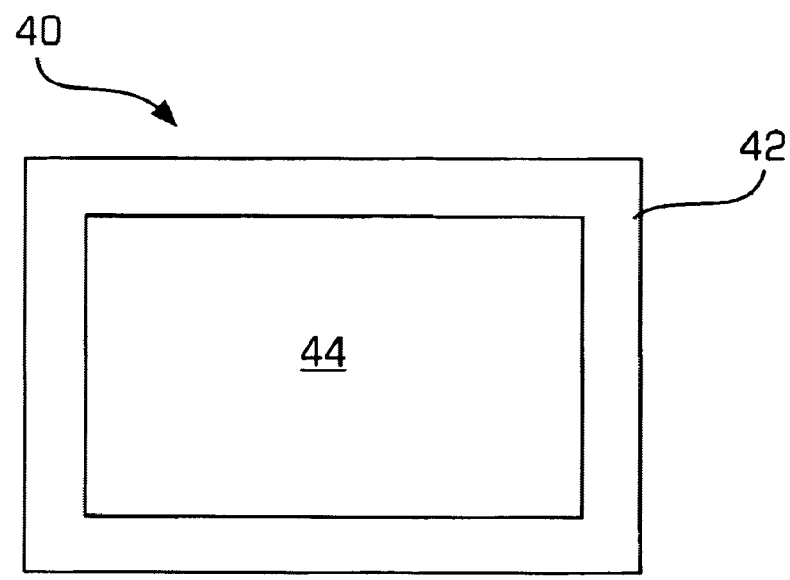
FIGS. 6A and 6B are diagrams illustrating another embodiment of the cleaning device in accordance with the invention.
Figure 6B:
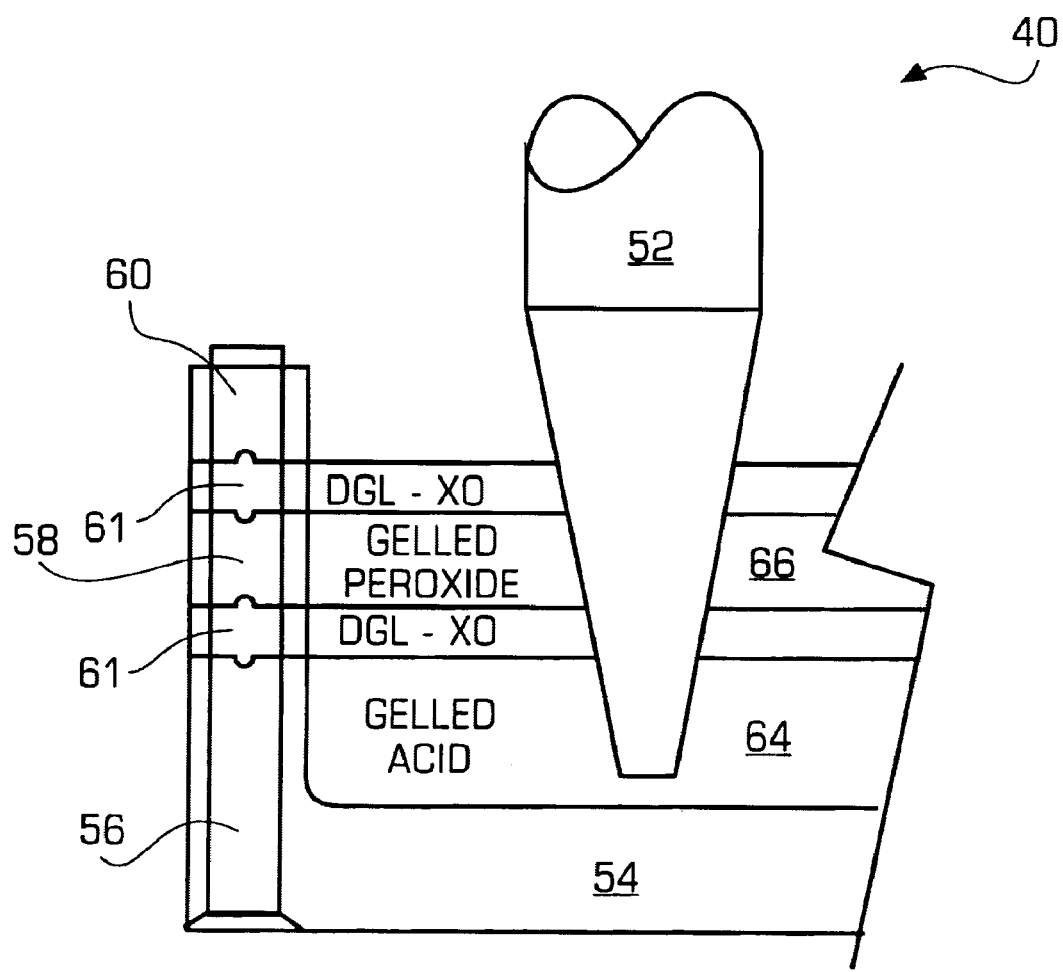

FIGS. 6A and 6B are diagram illustrating a second embodiment of a cleaning device 40 in accordance with the invention. In more detail, the cleaning device 40 may include one or more different layers of material which may clean or sharpen the probe elements as will now be described. Thus, in accordance with this embodiment of the invention, the cleaning pad may be placed on a substrate for use on the abrasive plate in the prober, the prober chuck, analyzer or any other machine. As shown in FIG. 6A, the cleaning device 40 may include a frame 42 that encloses one or more layers of chemical cells 44. The layers in the cleaning device may be made of a material which exhibits acetic or basic chemical properties which may be used to oxidize and/or reduce contaminates on the probe tips. The layers may also be made of materials that induce chemical reactions and/or mechanical actions that remove such contaminates. The removal of the contaminates, such as heavy metals, that may be environmentally hazardous will be trapped on or in the pad so that they will not be dispersed into the air. This embodiment will now be described in more detail with reference to FIG. 6B.

FIG. 6B is a diagram illustrating the second embodiment of a cleaning device 40 in accordance with the invention with a probe needle 52 inserted into the layers of the cleaning device in order to clean the probe needle. In more detail, the cleaning device may have a shape of a typical wafer so that it may be used in-line and may further include one or more different layers of material. In particular, the cleaning device 40 may include a substrate 54 having a wall wherein the wall may be constructed of several pieces made of chemically resistant material. The walls may include a bottom portion 56, a middle portion 58 and an upper portion 60 stacked on top of each other with a layer of elastomeric material 61 in between the portions of the wall. The walls of the substrate form a well region into which one or more different layers of chemicals may be placed and these chemicals may etch away materials struck onto the probe needles. A first bottom well 64 of the substrate may be filled with an acid matrix such as acetic acid, as described with reference to FIG. 7 and sealed into the well by a layer 61 of elastomeric material. The chemical matrix may consist of chemicals in any form, solid, liquid, gas, or encapsulated, emulsified, saturated, gelled, or the like, provided the amount of chemical induces the desired reaction. Once the seal is in place, the middle portion of the wall 58 may be positioned and secured to the seal by an adhesive, mechanical, thermal, or like methods to form a second well 66. In the second well 66, a peroxide mixture that gels is placed into the well as described in more detail with reference to FIG. 7, and sealed by a sealing layer 61. Finally, the upper portion 60 is secured to the top seal layer to form the cleaning device in accordance with the invention.

During the cleaning operation, the probe needle 52 may penetrate through the two seal layers 61 and thus extend into the acid and peroxide matrix layers in the wells. The acid and peroxide may react with the contaminates on the probe needle to remove heavy metals and the like. In particular, the acid and peroxide matrix may remove the contaminates from the probe needle and the contaminants may be trapped in the cleaning device by the sealing layers 61. Now, a method for manufacturing the cleaning device shown in FIGS. 6A and 6B will be described.

Figure 7:
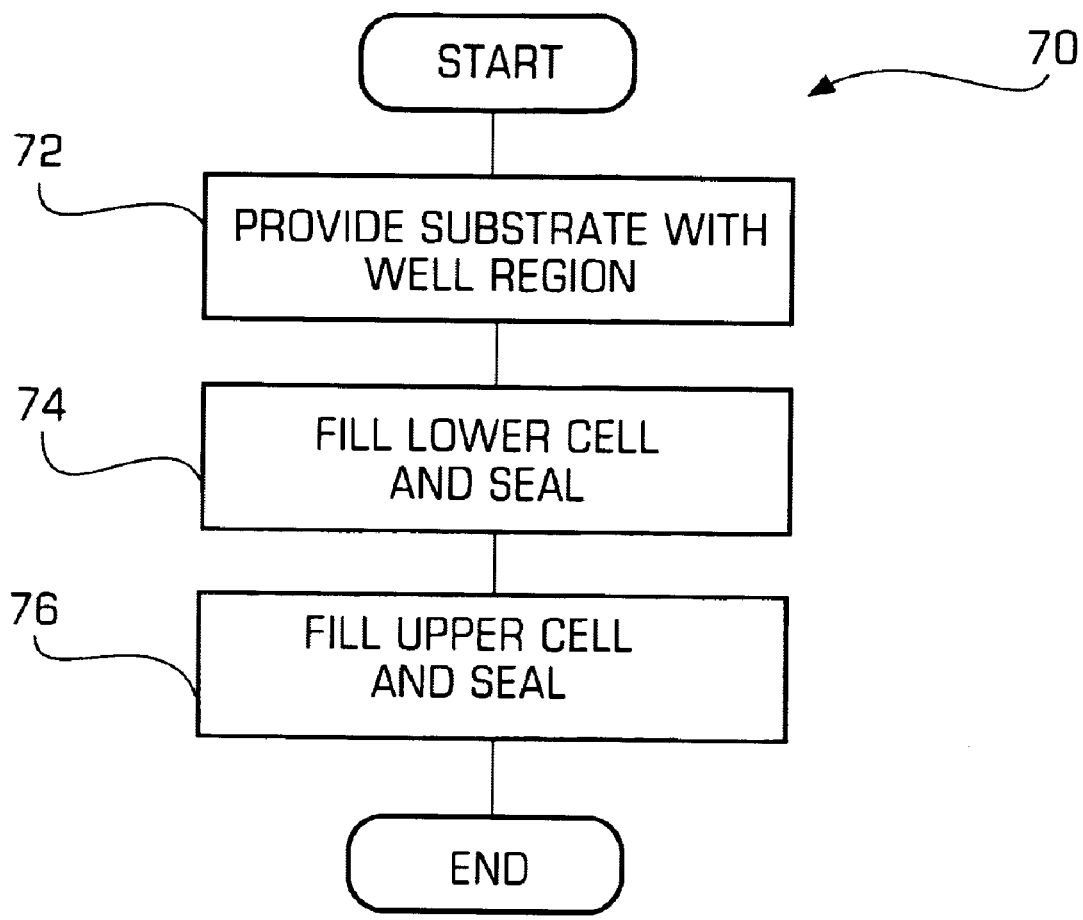
FIG. 7 is a flowchart illustrating a method for manufacturing the cleaning device shown in FIGS. 6A and 6B.

FIG. 7 is a flowchart illustrating a method 70 for manufacturing the cleaning device 40 shown in FIGS. 6A and 6B. In particular, in step 72, a substrate with a well region is provided. The substrate is typically made of a chemical resistant material such as certain types of plastic. In step 74, the lower cell of the substrate is filled with the appropriate chemicals and sealed using the elastomeric material. In step 76, the upper cell of the substrate is filled with the appropriate chemicals and sealed using the elastomeric material. Thus, a two layer cleaning device in accordance with the invention is formed. In accordance with the invention, however, the cleaning device may have any number of different layers of chemicals wherein each different layer may serve a particular function such as removing a different contaminant from the probe element. The above embodiment is typically used for a system that tests the wafers or one or more dies on a semiconductor wafer prior to being encapsulated into a package. Now, another embodiment of the cleaning device will be described wherein the cleaning device may be used for cleaning the probe elements of a handler or a tester that may be used to electrically test the leads of a packaged integrated circuit.

In accordance with another embodiment of the invention, the cleaning device described above may also be used in connection with an handling/testing apparatus that is used to handling and testing integrated circuits (IC) wherein an individual semiconductor die from the wafer described above has been encapsulated into a material, such as plastic. The IC package may have one or more electrical leads extending out from the package that communicate electrical signals, such as a power signal, a ground signal, etc., with the die inside of the package. The testing/handling apparatus may have a plurality of probe elements (similar to the probe card tester described above) that contact the leads of the package and test the electrical characteristics of the packaged IC in a typical manner. Similar to the probe card cleaner embodiment, the cleaning device may be, in a preferred embodiment, a semiconductor shaped substrate with a pad material wherein the probe elements of the handler/tester may contact the pad periodically to remove debris from the tips of the probe elements as described above. The various different materials used for the cleaning device including the multi-layer embodiment may be used with the tester/handler. The size of the cleaning device may be modified slightly to fit the size and shape of the particular tester/handler. In the multi-layer embodiment, a laminate-like structure may be used wherein the cleaning device has a pad/polymer layer on top of a substrate which is on top of another pad/polymer layer, or a first pad/polymer layer, a second pad/polymer layer underneath the first pad/polymer layer and a substrate underneath the second pad/polymer layer, etc. Thus, in accordance with the invention, the number of pad/polymer/substrate layers may be controlled to provide control of the overall thickness of the cleaning device as well as the compliance of the thickness of the cleaning device relative to the conditioning unit. This multi-layer embodiment would also provide "edge-side" cleaning for the interior of the socket and contactors of the prober. Now, another embodiment of the cleaning pad that permits a tester/prober to operate in an automatic cleaning mode will be described.

Most probers have an automatic cleaning mode in which the prober will automatically determine that its probe elements are dirty (using various mechanisms described below) and then perform a cleaning operation as needed. In accordance with the invention, the embodiments of the cleaning pad described below permit the prober to operate in the automatic cleaning mode. Thus, the cleaning pad embodiments described below permit the prober to automatically detect the surface of the cleaning pad (by various mechanisms described below) and therefore clean its probe elements automatically as described below in more detail. Now, two different embodiments of the cleaning device that permits the automatic cleaning of the probe elements will be described.

Figure 8A:
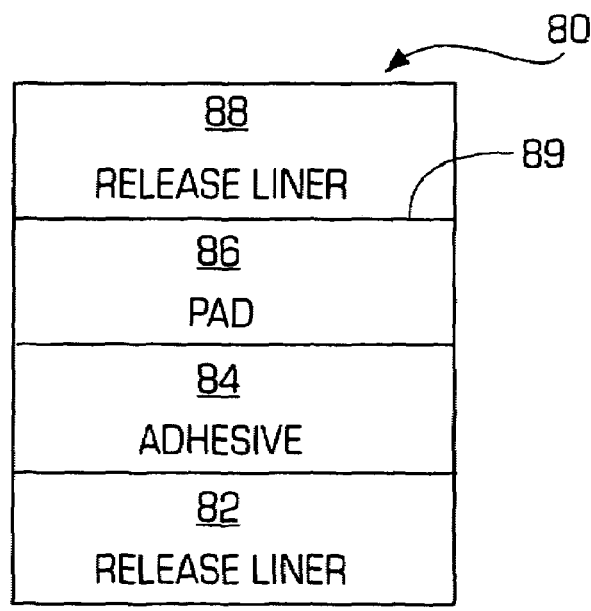
FIGS. 8A–8C are diagrams illustrating a matte finish cleaning device in accordance with the invention.
Figure 8B:
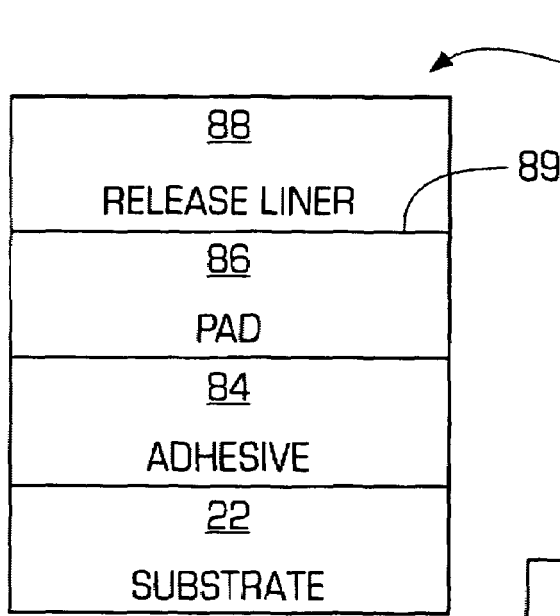
Figure 8C:
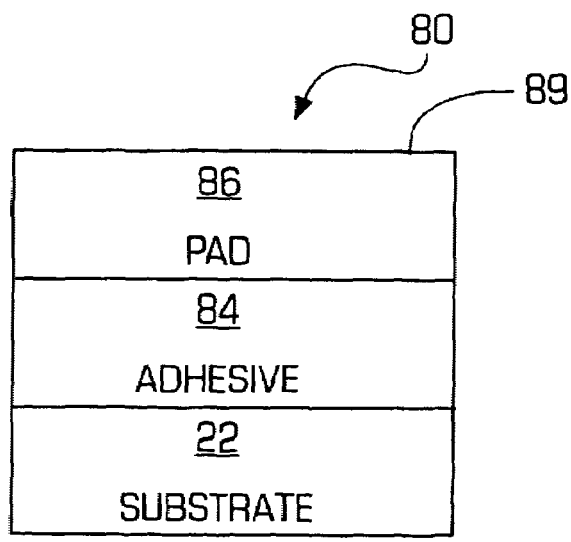

FIGS. 8A–8C are diagrams illustrating a cleaning device 80 in accordance with the invention with a matte surface finish. As shown in FIG. 8A, the cleaning device 80 initially has a first release liner layer 88 that is made of a known non-reactive polymeric film material and preferably made of a polyester (PET) film. The first release liner may have a matte finish or other "textured" features to improve the optical detection of the cleaning device and/or improve cleaning efficiency. A pad layer (working surface polymer) 86 is formed on the first release liner layer 88. The pad layer 86 is then formed on top of the adhesive layer wherein the pad layer is made from an elastomeric material that may include rubbers and both synthetic and natural polymers. The elastomeric material may be manufactured with a slight tackiness or some abrasive particulates added to the body of the material. The material may have a predetermined elasticity, density, and surface tension parameters that allow the tips to penetrate the elastomeric material and remove the debris on the test probe without damage to the test probe tip, the test probe contact surface, or test probe shape, while retaining the integrity of the elastomeric matrix and without material transfer from the cleaning material onto the contact surface of the test probe. Preferably, the pad material may be Probe Clean material that is commercially available from and manufactured by International Test Solutions, Inc.

Next, an adhesive layer 84 is formed on the pad layer 86. The adhesive layer is a compound and adheres a pad layer 86 to a substrate 22 (See FIG. 8B) when the cleaning device is applied to a substrate. In one form, the adhesive layer is comprised of a resin or cross-linked compound and can have a tack value of 1 to 300 gram-force. In another form, adhesive layer is comprised of a resin or cross-linked compound that is considered to be permanent, that is, the cleaning material will be damaged before the adhesive layer is compromised. Finally, a second release liner layer 82 (made of the same material as the first release liner layer) is formed on the adhesive layer 84 wherein the-second release liner layer (also known as the back release liner layer) may be subsequently removed to expose the adhesive layer 84. The first release liner layer 88 protects a working surface 89 of the pad layer 86 from debris/contaminants until the cleaning device 80 is ready to be used for cleaning a prober in a clean room. The cleaning device 80 as shown in FIG. 8A may be in the form that is shipped to an entity that uses a prober/tester.

Then, as shown in FIG. 8B, the second release liner layer 82 may be removed which exposes the adhesive layer 84. The adhesive layer 84 may then be placed against the substrate 22 to adhere the cleaning device 80 to the substrate. In accordance with the invention, the substrate may be a variety of different materials as described above which have different purposes. For example, the substrate may be a wafer, but it may also be applied to the top of the sanding/abrasion disk (such as that shown in FIG. 1) or other surfaces. As shown in FIG. 8B, the working surface 89 of the cleaning device 80 is still protected from contaminants and debris by the first release liner layer 88. When the user is ready to begin cleaning probe elements with the cleaning device 80 (and the cleaning device 80 is within the clean room with the prober/tester), the user removes the first release liner layer 88 as shown in FIG. 8C which exposes the cleaning pad layer 86 so that the prober may be cleaned. In accordance with the invention, the removal of the first release liner layer 88 leaves the working surface 89 of the cleaning pad layer with a matte finish. In the preferred embodiment, the surface finish, smoothness, texture, and/or surface morphology of the cleaning pad can be obtained, developed, or, imparted to reflect the smoothness, texture, and/or surface morphology of the release liner.

Furthermore, the surface finish of the cleaning polymer, as well as, the surface finish of the release liner can be modified by solvent-induced effects.

In accordance with the invention, a prober/tester that detects the position of a surface, such as a cleaning device, using light or optical energy to detect the working surface 89 of the cleaning device 80 due to the matte surface so that the cleaning device 80 shown in FIG. 8A-8C permits that prober to be run in an automatic cleaning mode as described in more detail below. For example, the prober may direct optical energy, such as visible light or infrared light or UV light, towards the working surface of the cleaning device and then receive the reflected light from the working surface of the cleaning device. From the received reflected optical energy, the prober is able to accurately determine the location of the working surface of the cleaning device as is well known. In contrast, a typical substrate, such as a wafer, with a mirror finish does not permit the tester/prober to determine the working surface of the substrate due to the reflectivity of the substrate. Now, another embodiment of the cleaning device 80 that permits a prober/tester to operate in an automatic cleaning mode will be described.

Figure 9:
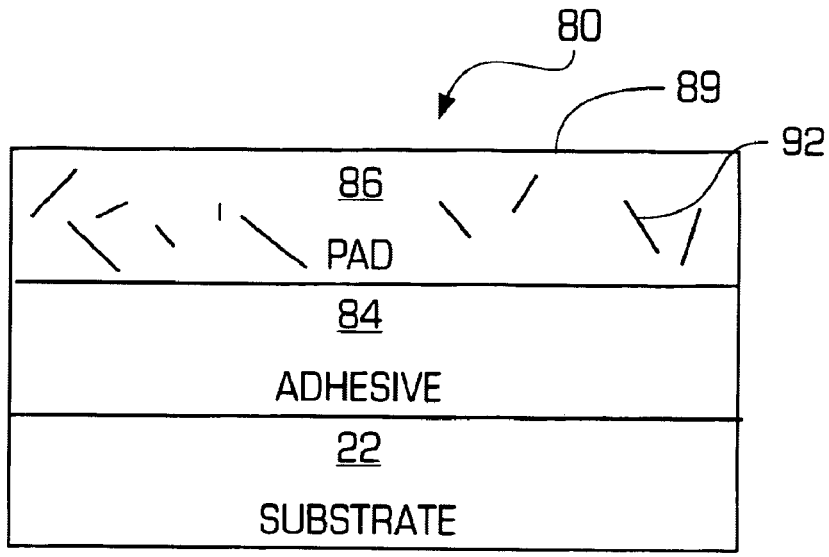
FIG. 9 is a diagram illustrating a conductive cleaning device in accordance with the invention.

FIG. 9 is a diagram illustrating a cleaning device 80 in accordance with the invention which is conductive. FIG. 9 illustrates a completed cleaning device 80 wherein the cleaning device 80 is adhered to a substrate 22 and the cleaning device 80 further comprises an adhesive layer 84 and a conductive cleaning pad layer 90. As above, the adhesive layer 84 adheres the cleaning pad layer 90 to the substrate 22. In this embodiment of the invention, the cleaning pad layer 90 is conductive so that a prober/tester that determines the location of a surface using conductance testing is able to accurately locate the working surface 89 of the cleaning pad layer 90. Thus, a prober/tester that performs a conductance test to detect a surface is able to operate in the automatic cleaning mode using the cleaning device 80 shown in FIG. 9. In accordance with the invention, the cleaning pad layer 90 may be made conductive using a variety of different methodologies. For example, the material of the cleaning pad layer 90 may include an additive which makes the cleaning pad layer 90 conductive. The conductive additive or filler may be, for example, conductive carbon-graphite particles or fibers, metal plated abrasive particulates or fibers, metallic particulates or fibers, which make the cleaning pad layer conductive. In the alternative, a well known conductive polymer material, such as polyanilenes, polypyrroles, polythiophenes, or other well known conductive polymer materials, may be used for the cleaning pad layer 90. A conductive element 92 is shown in FIG. 9 and may be implemented in various well known manners. The cleaning devices 80 shown are examples of the different embodiments of the invention which is a cleaning device that permits a prober/tester to detect the working surface of the cleaning device so that the tester/prober device is able to operate in an automatic cleaning mode. It is desirable to operate the prober/tester in the automatic cleaning mode which reduces the involvement of humans (and reduces the errors and contaminants) and also increases the throughput of the prober/tester. Now, an automatic prober/tester cleaning method in accordance with the invention will be described in more detail.

Figure 10:
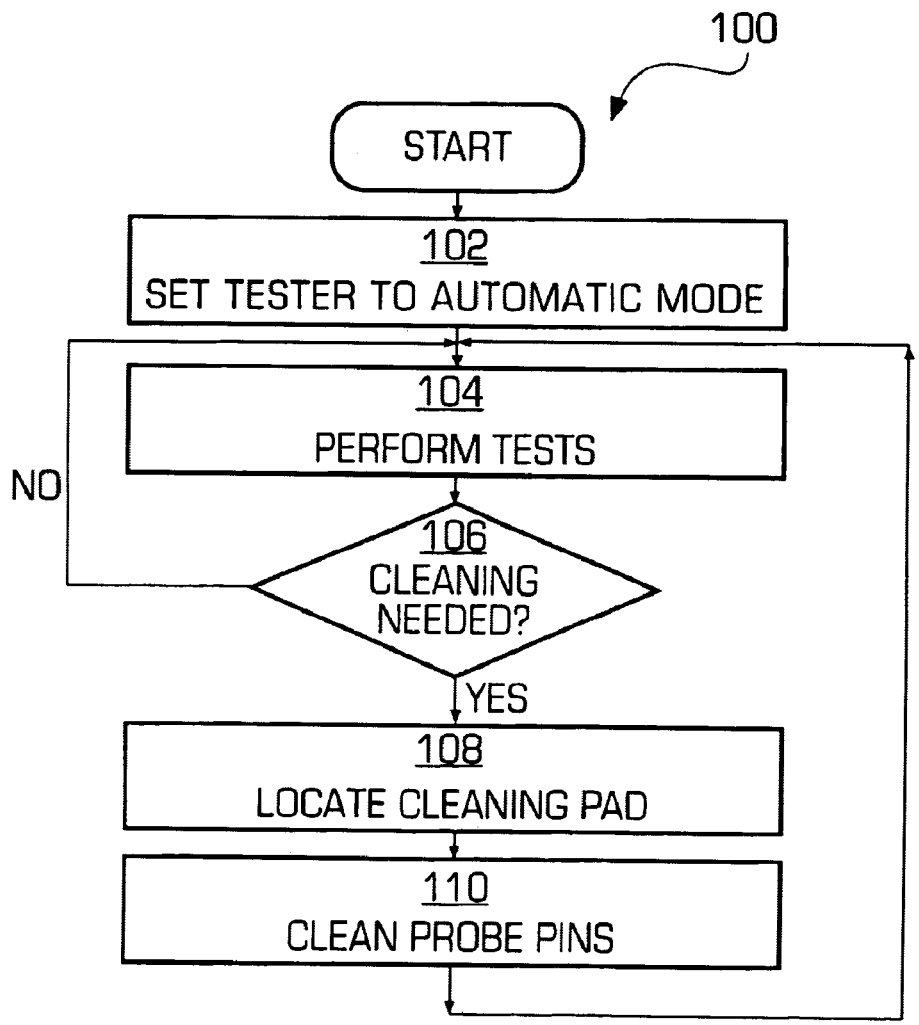
FIG. 10 is a diagram illustrating an automatic prober/tester cleaning method in accordance with the invention.

FIG. 10 is a diagram illustrating an automatic prober/tester cleaning method 100 in accordance with the invention. In a preferred embodiment, the method is implemented by software code/firmware (a sequence of computer instructions) residing in the prober device or in the tester device that is executed by a well known processor of the tester/prober device. The method may also be implemented using code that is hard-coded into a hardware device such as a microcontroller or other device. In step 102, the tester/prober is set into the automatic cleaning mode. In step 104, the prober performs its testing operations. In step 106, the prober/tester determines if a cleaning is needed. The prober/tester may determine the desirability of cleaning using a variety of methods. For example, the prober/tester may monitor the parameters being determined by the tester and then choose to start a cleaning step when the parameters vary by some predetermined amount from the normal value. In the alternative, the prober/tester might clean at a fixed period rate (a predetermined number of testing operations before a clean operation.) Obviously, the prober/tester may determine the desirability of a cleaning step/process in various ways known to those of ordinary skill in the art. If a cleaning is not needed, then the prober/tester loops back to step 104 and continues testing. If a cleaning is needed, then, in step 108, the prober/tester locates the position of the working surface of the cleaning device in accordance with the invention (using various methods including those described above of optical detection or conductance detection.) Then, in step 110, the cleaning step is performed and the method loops back to step 104 to continue testing. Preferably, the cleaning device in accordance with the invention is located adjacent the tester/prober, such as on the sanding disk 16 shown in FIG. 1 so that a wafer with the cleaning device does not need to be moved into position. Thus, using the cleaning method described above, the throughput of the prober/tester is increased since the prober/tester may rapidly clean its probe elements and then resume testing with minimal delay.

In other embodiments of the cleaning system, a permanent adhesive may be used to affix the cleaning polymers onto the polyester substrate. The permanent adhesive prevents the polymer materials from sliding and maintains the integrity of the various material layers during the cleaning operation. The use of this permanent adhesive material better facilitates translational motion during the probe card cleaning operations.

The cleaning materials are currently applied onto a polyester film or directly onto a silicon wafer. The materials can also be directly applied to metallic substrates, such as aluminum and stainless, as well as onto ceramic substrates or practically any shape and size. In fact, the cleaning materials can be applied to practically any sort of substrate, within reason. The materials have applicability without a substrate and can be used for non-probe card related contactor cleaning applications.

For the Probe Scrub material, different substrates may be used for the abrasive lapping film. The abrasives in the standard lapping film are applied to a polyester backing and then the cleaning polymer is applied across the surface of the lapping film. In addition, "non-standard" substrates for the lapping film (polyester and low temperature epoxy binders for the abrasive particles seem to be the industry standard for abrasive, lapping materials) may be used. For these applications, a lapping film constructed from either a fabric substrate and a metallic foil substrate (or some combination) onto which the cleaning polymer will be applied may be used. Furthermore, a high temperature binder for the abrasive particles of the lapping film may be used. This combination of temperature resistant material layers will facilitate the use of Probe Scrub across a much wider temperature range.

While the foregoing has been with reference to a particular embodiment of the invention, it will be appreciated by those skilled in the art that changes in this embodiment may be made without departing from the principles and spirit of the invention, the scope of which is defined by the appended claims.

The invention claimed is:

1. A method for fabricating a cleaning device whose working surface is capable of being detected by a prober device, the method comprising:
   forming a cleaning device having a working surface by forming a first release liner layer, forming a cleaning pad layer having a working surface on the first release liner layer, forming an adhesive layer on the cleaning pad layer, and forming a second release liner layer on the adhesive layer wherein the first release liner layer is removed to create the matte finish of the working surface; and removing a layer from the working surface wherein the removal of the layer imparts a matte finish to the working surface of the cleaning device.

2. A method for testing semiconductor devices in an automatic cleaning mode, the method comprising:
performing testing of semiconductor devices;
during the testing operation, automatically determining that a cleaning is to be performed;
automatically determining the location of a working surface of a cleaning device based on a characteristic of the working surface by directing optical energy towards the working surface of the cleaning device and determining the location of the working surface of the cleaning device based on the optical energy reflected off of the working surface of the cleaning device;
performing the cleaning using the cleaning device; and
continuing the testing of semiconductor devices.

3. The method of claim 2, wherein determining the working surface of the cleaning device further comprises measuring the conductance of the working surface of the cleaning device in order to determine the position of the working surface of the cleaning device.

4. The method of claim 2, wherein performing the cleaning further comprises moving a probe element in a horizontal motion.

5. The method of claim 2, wherein performing the cleaning further comprises moving a probe element in an orbital motion.

6. A method for testing packaged semiconductor devices, the method comprising:
performing testing of the packaged semiconductor devices;
during the testing operation, automatically determining that a cleaning is to be performed;
automatically determining the location of a working surface of a cleaning device based on a characteristic of the working surface by directing optical energy towards the working surface of the cleaning device and determining the location of the working surface of the cleaning device based on the optical energy reflected off of the working surface of the cleaning device;
performing the cleaning using the cleaning device; and
continuing testing of packaged semiconductor devices.

7. The method of claim 6, wherein determining that cleaning is to be performed further comprises measuring the parameters of each semiconductor device being tested and initiating a cleaning step when the measured parameters vary from a normal value.

8. The method of claim 6, wherein determining that cleaning is to be performed further comprises performing a cleaning step after a predetermined number of testing operations.

9. The method of claim 8, wherein determining the working surface of the cleaning device further comprises measuring the conductance of the working surface of the cleaning device in order to determine the position of the working surface of the cleaning device.

10. The method of claim 8, wherein performing the cleaning further comprises moving a probe element in a horizontal motion.

11. The method of claim 8, wherein performing the cleaning further comprises moving a probe element in an orbital motion.

* * * * *